United States Patent
van Hest et al.

(10) Patent No.: US 9,647,158 B2
(45) Date of Patent: May 9, 2017

(54) PHOTOVOLTAIC SUB-CELL INTERCONNECTS

(71) Applicant: Alliance for Sustainable Energy, LLC, Golden, CO (US)

(72) Inventors: Marinus Franciscus Antonius Maria van Hest, Lakewood, CO (US); Heather Anne Swinger Platt, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 182 days.

(21) Appl. No.: 14/283,349

(22) Filed: May 21, 2014

(65) Prior Publication Data

US 2014/0345673 A1 Nov. 27, 2014

Related U.S. Application Data

(60) Provisional application No. 61/825,853, filed on May 21, 2013.

(51) Int. Cl.
  *H01L 31/04* (2014.01)
  *H01L 31/0465* (2014.01)
  *H01L 31/0463* (2014.01)

(52) U.S. Cl.
  CPC ...... *H01L 31/0465* (2014.12); *H01L 31/0463* (2014.12); *Y02E 10/50* (2013.01)

(58) Field of Classification Search
  None
  See application file for complete search history.

(56) References Cited

U.S. PATENT DOCUMENTS

| | | | |
|---|---|---|---|
| 7,259,321 B2 | 8/2007 | Oswald et al. | |
| 8,109,004 B2 | 2/2012 | Shenderovich et al. | |
| 8,207,009 B2 | 6/2012 | Frey | |
| 8,227,287 B2 | 7/2012 | Ghandour | |
| 8,329,496 B2 * | 12/2012 | Ghandour | H01L 31/188 219/121.69 |
| 8,362,354 B2 * | 1/2013 | Shinohara | H01L 31/0463 136/244 |
| 8,377,737 B1 * | 2/2013 | Schaffer | H01L 31/0296 438/85 |
| 8,449,782 B2 * | 5/2013 | Lim | H01L 31/188 216/24 |
| 2002/0066478 A1 * | 6/2002 | Hayashi | H01L 31/0236 136/244 |

(Continued)

OTHER PUBLICATIONS

Birkmire, et al., "CdTe thin film technology: Leading thin film PV into the future", Current Opinion in Solid State and Materials Science, vol. 14, Issue 6, Dec. 2010, pp. 139-142.

(Continued)

*Primary Examiner* — Benjamin Sandvik
(74) *Attorney, Agent, or Firm* — Robert G. Pittelkow (57) ABSTRACT

Photovoltaic sub-cell interconnect systems and methods are provided. In one embodiment, a photovoltaic device comprises a thin film stack of layers deposited upon a substrate, wherein the thin film stack layers are subdivided into a plurality of sub-cells interconnected in series by a plurality of electrical interconnection structures; and wherein the plurality of electrical interconnection structures each comprise no more than two scribes that penetrate into the thin film stack layers.

6 Claims, 7 Drawing Sheets

(56) References Cited

U.S. PATENT DOCUMENTS

| | | | |
|---|---|---|---|
| 2003/0044539 A1 | 3/2003 | Oswald | |
| 2005/0284517 A1* | 12/2005 | Shinohara | H01L 31/076 136/256 |
| 2010/0012353 A1 | 1/2010 | Milshtein et al. | |
| 2010/0233386 A1* | 9/2010 | Krause | H01L 31/022425 427/596 |
| 2010/0255628 A1 | 10/2010 | Milshtein et al. | |
| 2012/0000529 A1 | 1/2012 | Frey | |
| 2012/0091105 A1* | 4/2012 | Ghandour | H01L 31/188 219/121.69 |

OTHER PUBLICATIONS

Chopra, et al., "Thin-Film Solar Cells: An Overview", Progress in Photovoltaics: Research and Applications, vol. 12, Issue 2-3, Mar.-May 2004, pp. 69-92.

Curtis, et al, "Direct Write Metallizations for Ag and Al", Materials Research Society Symposium Proceedings, vol. 624, 2000, pp. 59-64.

Curtis, et al., "Spray and Inkjet Printing of Hybrid Nanoparticle-Metal-Organic Inks for Ag and Cu Metallizations", Materials Research Society Symposium Proceedings, vol. 676, 2001, pp. Y8.6.1-Y8.6.6.

Dhere, "Scale-up issues of CIGS thin film PV modules", Solar Energy Materials & Solar Cells, vol. 95, Issue 1, Jan. 2011, pp. 277-280.

Dhere, et al., "Thin-film photovoltaics", Journal of Vacuum Science and Technology A, vol. 23, Issue 4, Jul. 2005, pp. 1208-1214.

Habas, et al., "Low-Cost Inorganic Solar Cells: From Ink to Printed Device", Chemical Reviews, vol. 110, Issue 11, Nov. 10, 2010, pp. 6571-6594.

Kessler, et al., "Technological aspects of flexible CIGS solar cells and modules", Solar Energy, vol. 77, Issue 6, Dec. 2004, pp. 685-695.

Loffler et al., "Depth selective laser scribing for thin-film silicon solar cells on flexible substrates," 34th IEEE Photovoltaic Specialists Conference (PVSC), pp. 001227-001231, Jun. 7-12, 2009, Philadelphia, PA.

Loffler et al., "Laser scribing and printing processes for thin-film PV devices," 37th Photovoltaic Speicalists Conference (PVSC), pp. 003451-003454, Jun. 19-24, 2009, Seattle, WA.

Wipliez et al., "Monolithic series interconnections of flexible thin-film PV devices," Proceedings of the 26th European Conference on Photovoltaic Solar Energy, pp. 2641-2644, Sep. 5-9, 2011, Hamburg, Germany.

* cited by examiner

PHOTOVOLTAIC SUB-CELL INTERCONNECTS

CROSS-REFERENCE TO RELATED APPLICATION

This application claims priority to, and the benefit of, U.S. Provisional Application No. 61/825,853 entitled "Systems and Methods for Photovoltaic Sub-cell Interconnect" and filed on May 21, 2013, which is herein incorporated by reference in its entirety.

CONTRACTUAL ORIGIN

The United States Government has rights in this invention under Contract No. DE-AC36-08GO28308 between the United States Department of Energy and the Alliance for Sustainable Energy, LLC, the manager and operator of the National Renewable Energy Laboratory.

BACKGROUND

The process of fabricating thin film photovoltaic (PV) modules includes steps which subdivide layers into individual series connected solar cells. For example, in the existing art, for each interconnection fabricated, the fabrication process typically involves cutting three or more scribes. This includes opening scribes into one or more already deposited layers before subsequent layers are deposited to create electrical interconnects. Then, a final scribe is cut partially into the layers to form electrically distinct PV cells.

Such alternating steps of depositing and scribing and depositing require precision alignments so that the opening of scribes is performed in a fashion that avoids destroying or damaging structures created in previous scribing and depositing steps. That is, each scribe after the first scribe must be aligned in parallel such as to avoid re-scribing a region where a previous scribe was formed. One problem with performing such precision alignments is that performing the alignments takes an appreciable amount of time, which slows the rate at which PV modules can be fabricated. Alternately, when implemented in industrial fabrication facilities, precision alignment is often sacrificed in favor of throughput. Thus to compensate for the lower precision alignments, greater distances between scribes are provided, which increases the total area of the resulting interconnect. Since regions of the PV module where interconnects exist do not contribute to the PV current generation, one direct consequence of the lower precision alignments is that a smaller region of the module is available for PV current generation. For example, for a sub cell that is 10 mm wide, a ½ mm (500 um) interconnect region results in 5% loss of each cell's area that can contribute to PV generation. Therefore, for the reasons described above, there is a need in the art for systems and methods for providing narrower electrical interconnects that do not require high precision alignments.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments of the present disclosure provide for sub-cell interconnects which are smaller than those currently available by introducing improved methods for fabricating sub-cell interconnects. The methods describe herein utilize either single scribing or double scribing processes to perform both the task of physically subdividing a starting material of thin film stack layers into a plurality of sub-cells, and the task of forming electrical interconnects between neighboring sub-cells. Further, the methods introduced by the present disclosure avoid alignment problems by performing the scribing and electrical interconnect formation after deposition of the thin film stack layers has been completed. That is, it is not necessary to re-align the scribe tool after each layer deposition, but only once prior to the first scribing. Further, this disclosure introduces a system having a hybrid interconnection tool that combines both a scribing tool (which may be either a mechanical tool or an optical/laser tool) and a printing tool for depositing electrical interconnection structures within scribes created by the scribing tool. Such a hybrid interconnection tool provides for still further alignment advantages since knowledge of scribing tool positioning can immediately translate into knowledge of printing tool positioning.

Both the double scribing and single scribing interconnection methods are described below. The double scribing interconnection method utilizes two separate scribing steps of differing penetration depths that result in an interconnection region slightly wider than achieved by the single scribing interconnection method, but can be utilized in conjunction with a very wide range of solar cell technologies and materials. The single scribing interconnection method results in a narrower interconnection region than the double scribing interconnection method, but is more restrictive in the materials which may be used to deposit the electrical interconnection structures with the single scribe. In one embodiment, an interconnection formed by a single scribing interconnection would be on the order of 120 µm while an interconnection formed by a double scribing interconnection would be on the order of 240 µm. However, it should be appreciated that significantly narrower interconnections can be achieve through both the double scribing and single scribing processes described herein as the technology for creating narrower scribes and precision material deposition improves. In any of the embodiments described herein, a material printing process may be employed as one option for performing material depositions.

It should also be appreciated that, the methods describe herein may be implemented to achieve embodiments having either rigid or flexible substrates. It should be noted that the term "substrate" is used generically in this application to refer to a base foundation layer which includes what may alternately be referred to by those of skill in the art as a substrate or superstrate layer. For example, in one embodiment, the methods described here may be applied to thin film stack layers comprising an inverted thin-film stack used for CdTe modules. Alternatively, the methods may be applied to thin film stack layers comprising non-inverted structures such as those employed for CIS or CIGS solar cells. These alternatives are provided as examples only and are not limiting. Further, embodiments are not limited to only including applications pertaining to thin film PV. For example, embodiments may be implemented for other thin film semiconductor applications as well. Also, although options for embodiments where both the upper and lower contacts are metal have been mentioned throughout this application, it should be appreciated that for solar applications, at least one set of contacts should ideally be transparent to permit light to enter the device.

Figure 1A:
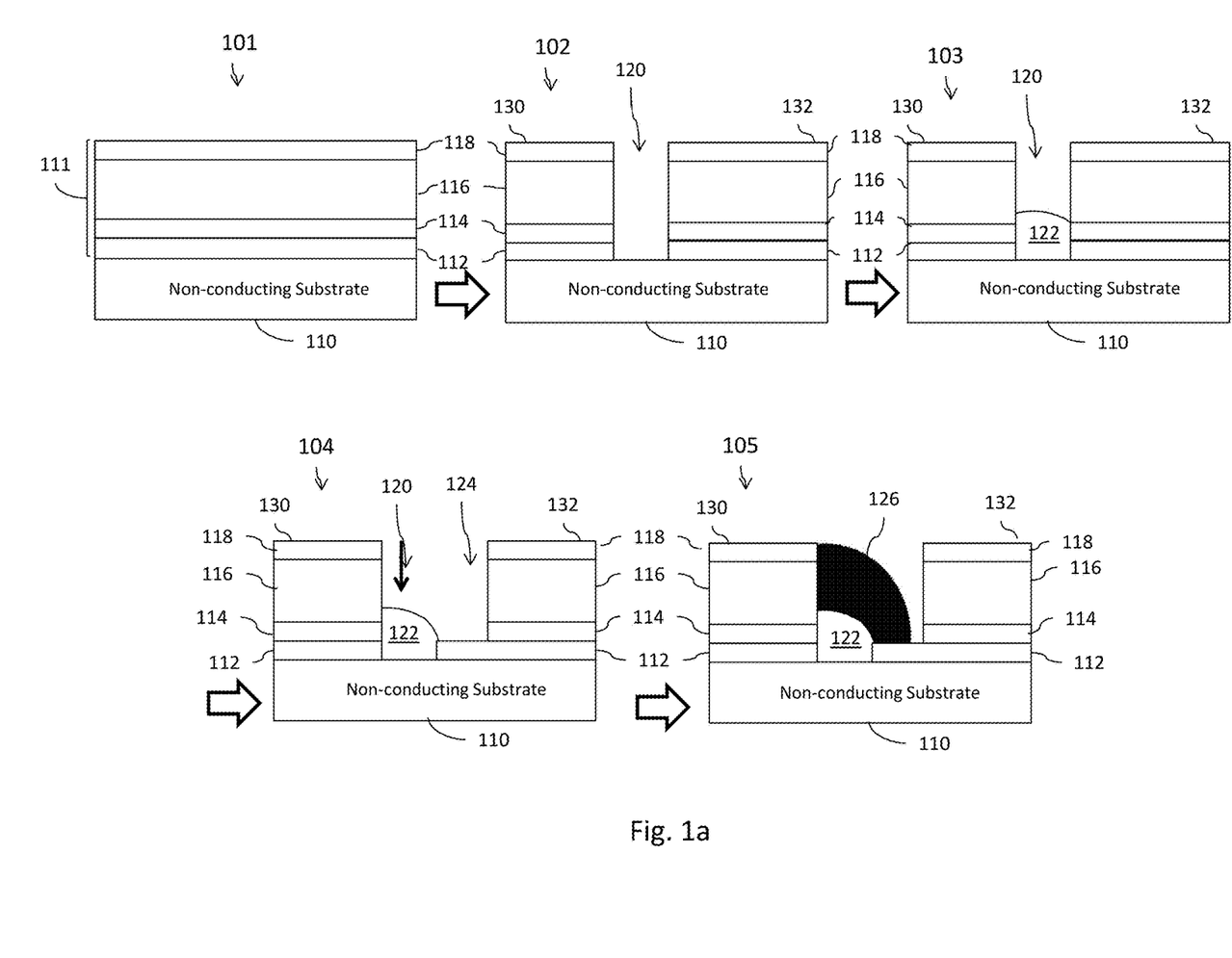
FIGS. 1a and 1b provide a block diagram and accompanying flow chart illustrating a method for fabricating sub-cell interconnects of one embodiment of the present disclosure.
Figure 1B:
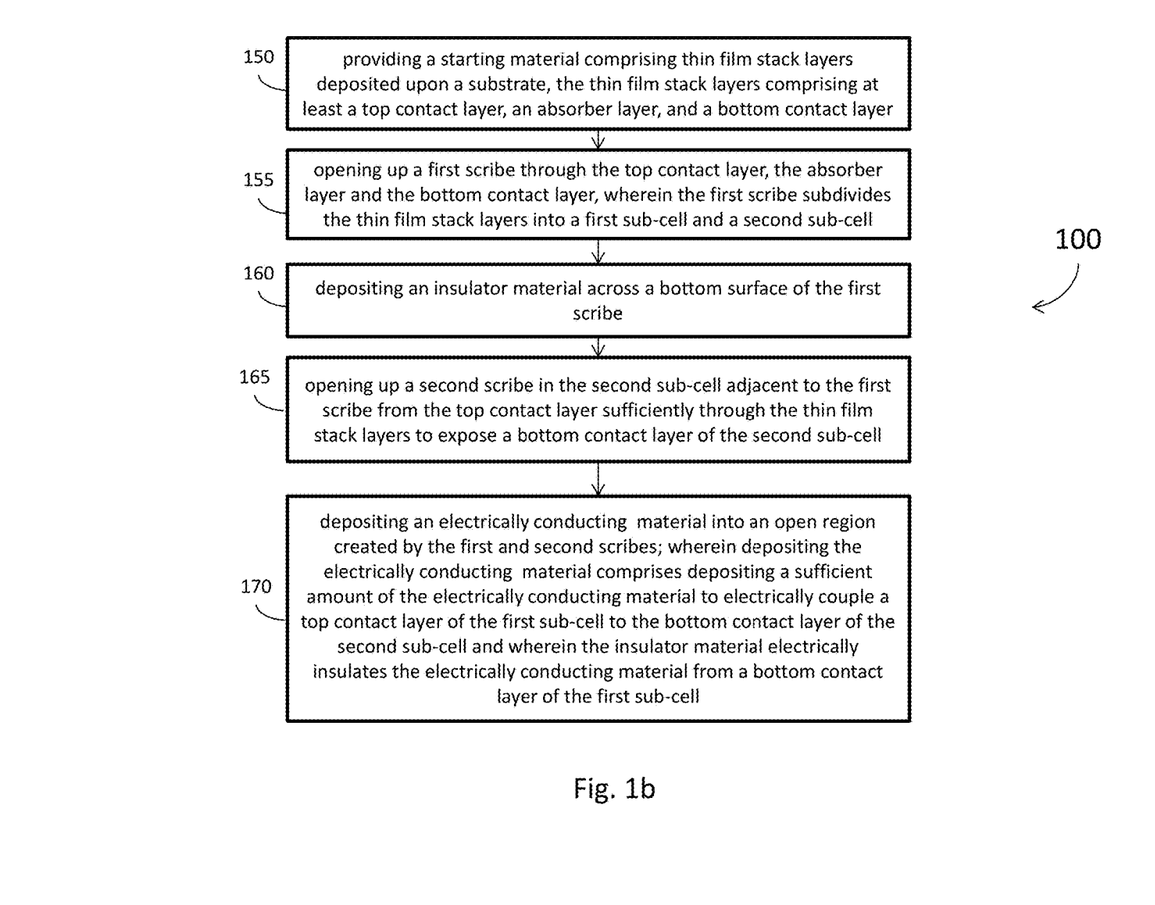

FIGS. 1a and 1b provide a block diagram and accompanying flow chart illustrating a method 100 for fabricating sub-cell interconnects of one embodiment of the present disclosure. The method presented in FIGS. 1a and 1b may be characterized as a double scribing interconnection method. The method begins at 150 with providing a starting material comprising thin film stack layers 111 deposited upon a substrate 110, the thin film stack layers comprising at least a top contact layer 118, an absorber layer 116, and a bottom contact layer 112. This is illustrated generally at 101. In one embodiment, substrate 110 is a transparent substrate comprising a transparent electrically insulating material such as a glass or polyethylene terephthalate (PET) material. In other embodiments, substrate 110 may be opaque or otherwise non-transparent. As shown in FIG. 1a, the thin film stack layers 111, in addition to the bottom contact layer 112, absorber layer 116 and top contact layer 118, may also includes a buffer or window layer 114. Regarding the two contact layers 112 and 118, one or both may be fabricated using a transparent conducting material (such as a transparent conducting oxide, TCO) or other transparent conducting material, or alternatively one or both may comprise non-transparent conducting materials such as a metal contact material. In this "inverted" configuration, light may enter through a transparent substrate and penetrate to the absorber layer 116. Absorber layer 116 may incorporate one of a wide range of photovoltaic materials, such as but not limited to, CdTe, InP, copper indium selenide (CIS), copper indium gallium diselenide (CIGS), crystalline-Si, amorphous-Si, or thin film organics.

The method proceeds to 155 with opening up a first scribe 120 through the top contact layer 118, the absorber layer 116 and the bottom contact layer 112. The first scribe 120 subdivides the thin film stack layers 111 into a first sub-cell 130 and a second sub-cell 132, electrically separated from each other, as illustrated generally at 102.

The method next proceeds to 160 with depositing an insulator material 122 across the bottom surface of the scribe 120, for example, from the first sub-cell 130 to the second sub-cell 132, as illustrated generally at 103. For example, in one embodiment, a dielectric material layer may be deposited at step 160 to electrically insulate the bottom contact layer 112 and window layer 114 of the first sub-cell 130 from those of the second sub-cell 132.

The method next proceeds to 165 with opening up a second scribe 124 in the second sub-cell 132 adjacent to the first scribe 120 from the top contact layer 118 sufficiently through the thin film stack layers 110 to expose a bottom contact layer 112 of the second sub-cell 132. The second scribe 124 is positioned adjacent to the first scribe 120 such as to create a single open region between the first and second sub-cells 130, 132, as illustrated generally at 104. At least some portion of the bottom contact layer 112 may be removed by the second scribe to expose the bottom contact layer 112 to that open region. The second scribe 124 thus provides access for subsequently deposited material (described in the next step) to electrically connect the top contact layer 118 of sub-cell 130 with the bottom contact layer 112 of sub-cell 132.

Figure 1C:
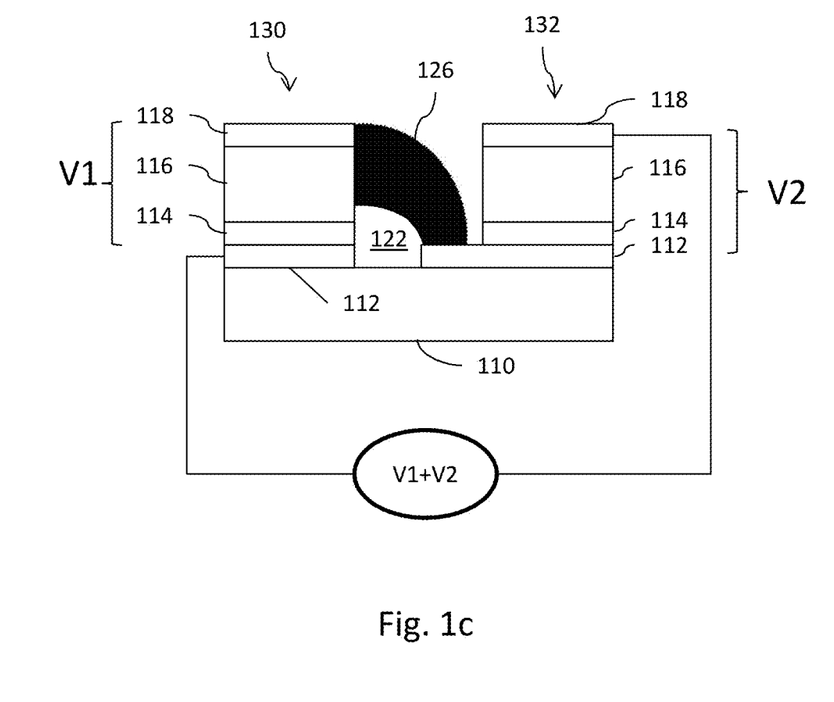
FIG. 1c illustrates voltage summation of series interconnected sub-cells.

Accordingly, the method next proceeds to 170 with depositing an electrically conducting material 126 into an open region created by the first and second scribes 120, 124. In this step, depositing the electrically conducting material 126 comprises depositing a sufficient amount of the electrically conducting material 126 to electrically couple a top contact layer 118 of the first sub-cell 130 to the bottom contact layer 112 of the second sub-cell 132. Further, the insulator material 122 electrically insulates the electrically conducting material 126 from a bottom contact layer 112 of the first sub-cell 130. This is illustrated generally at 105. This resulting electrical interconnection structure creates a series interconnection of the first sub-cell 130 and second sub-cell 132 that sums the voltages generated by each respective sub-cell and drives photo generated current preferentially from one sub-cell to the next so it can eventually be collected at the edges of the module. For example, as illustrated in FIG. 1c, the series connection results in the voltage produced by sub-cell 130 (V1) being summed with the voltage produced by sub-cell 132 (V2) so that the total voltage produced across contact 112 of sub-cell 130 to contact 118 of sub-cell 130 is V1+V2. Such a low current configuration is beneficial in that a minimal amount of conductive material is necessary to transport the resulting current. Steps 155 to 170 of the method 100 may be repeated as many times as needed until the original thin film stack layers 111 have been divided into the desired number of series interconnected sub-cells.

Figure 2A:
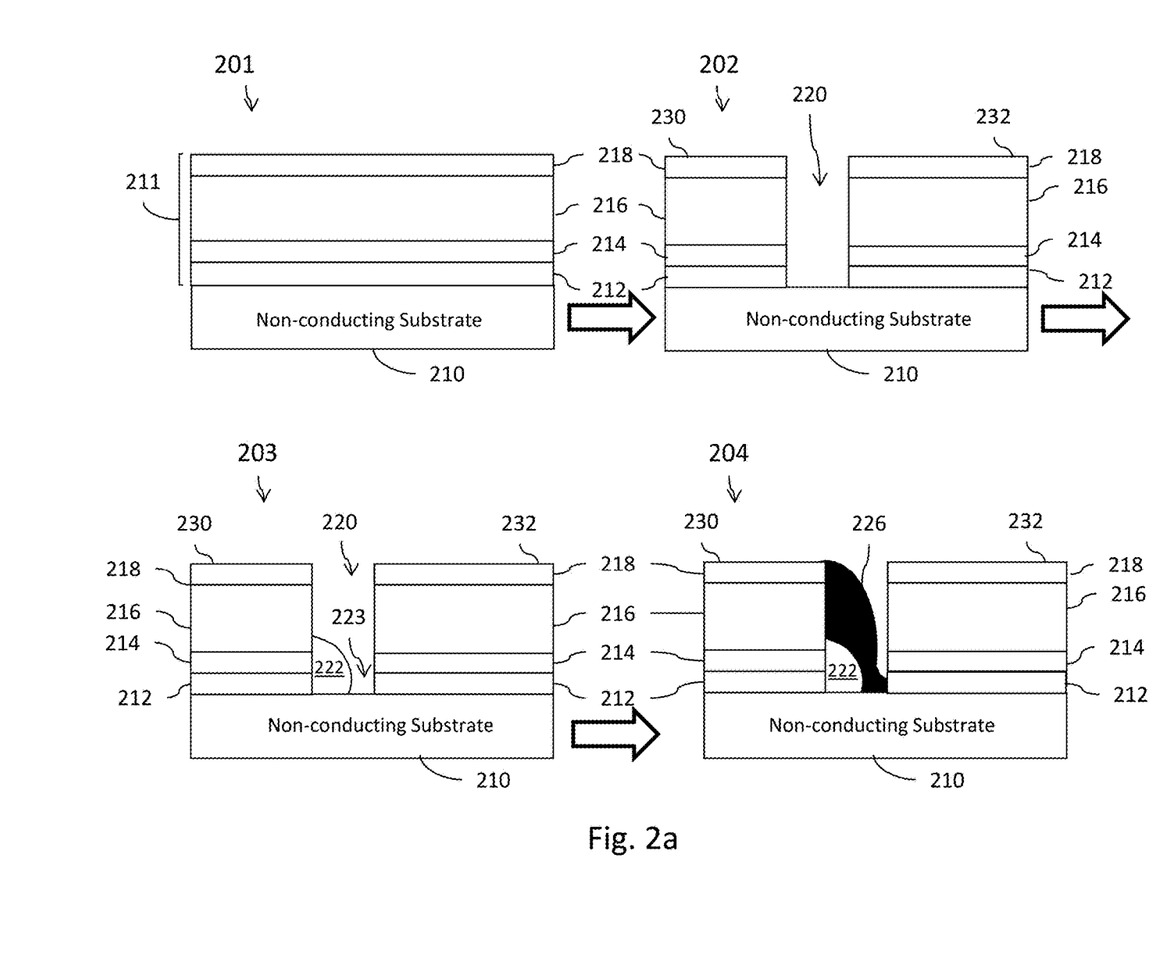
FIGS. 2a and 2b provide a block diagram and accompanying flow chart illustrating a method for fabricating sub-cell interconnects of one embodiment of the present disclosure.
Figure 2B:
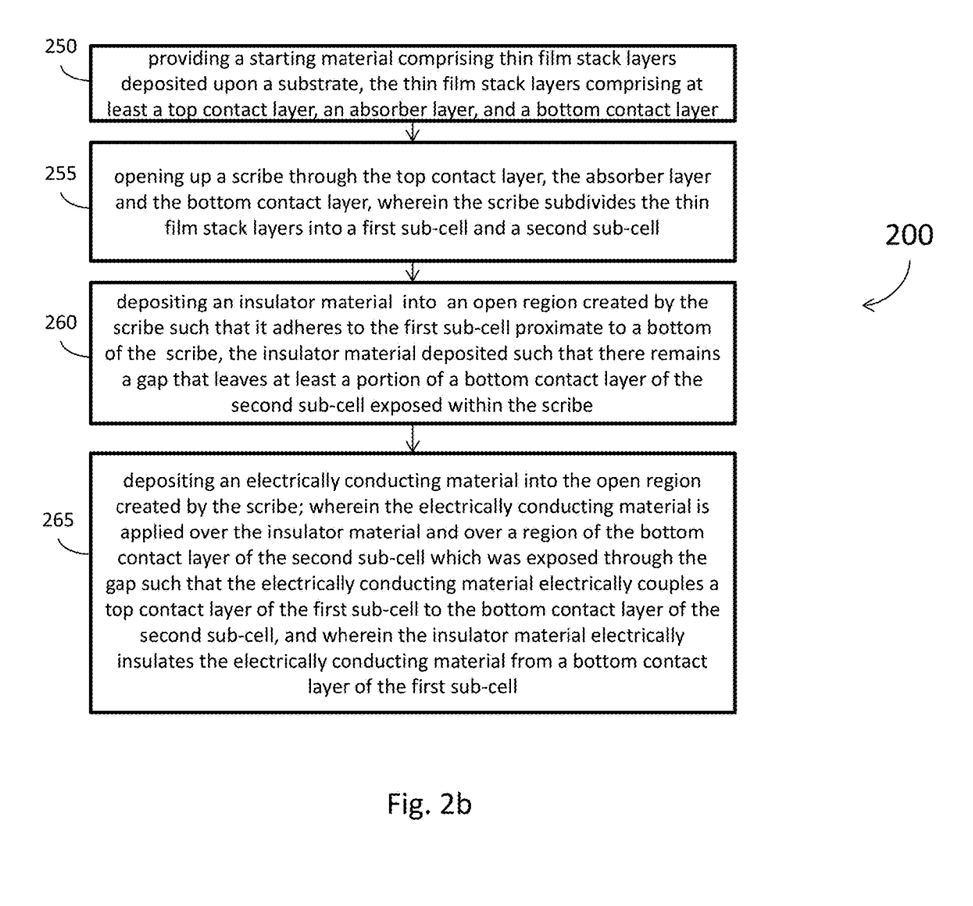

FIGS. 2a and 2b provide a block diagram and accompanying flow chart illustrating a method for fabricating sub-cell interconnects of one embodiment of the present disclosure. The method presented in FIGS. 2a and 2b may be characterized as a single scribing interconnection method. The method begins at 250 with providing a starting material comprising thin film stack layers 211 deposited upon a substrate 210, the thin film stack layers 211 comprising at least a top contact layer 218, an absorber layer 216, and a bottom contact layer 212, as illustrated generally at 201. In one embodiment, substrate 210 is a transparent substrate comprising a transparent electrically insulating material such as a glass or PET material. In other embodiments, substrate 210 may be opaque or otherwise non-transparent. In one embodiment, the thin film stack layers 211, in addition to the bottom contact layer 212, the absorber layer 216 and top contact layer 218, may further include a buffer or window layer 214. Regarding the two contact layers 212 and 218, one or both may be fabricated using a transparent conducting oxide (TCO) or other transparent conducting material, or alternatively one or both may comprise non-transparent conducting materials such as a metal contact material. In the "inverted" configuration, light may enter the through a transparent substrate and penetrate to the absorber layer 216. Absorber layer 216 may incorporate one of a wide range of photovoltaic materials, such as but not limited to, CdTe, InP, copper indium selenide (CIS), copper indium gallium diselenide (CIGS), crystalline-Si, amorphous-Si, or thin film organics.

The method proceeds to 255 with opening up a scribe 220 through the top contact layer 218, the absorber layer 216 and the bottom contact layer 212, wherein the scribe 220 subdivides the thin film stack layers 211 into a first sub-cell 230 and a second sub-cell 232, which are electrically separated from each other. This is illustrated generally in FIG. 2a at 202.

The method next proceeds to 260 with depositing an insulator material 222 into an open region created by scribe 220 such that it adheres to the first sub-cell 230 proximate to a bottom of the scribe 220. The insulator material 222 is deposited such that there remains a gap 223 that leaves at least a portion of a bottom contact layer 212 of the second sub-cell 232 exposed within the scribe 220, as illustrated generally at 203. It should be noted that the insulator material 222 does not go all the way across the bottom of scribe 220. Instead, after depositing of the insulator material 222 within the scribe 220, there remains a gap 223 that leaves at least a portion of the bottom contact layer 212 of the second sub-cell 232 exposed within the scribe 220 region. For example, in one embodiment, a dielectric material layer is deposited (e.g., printed) onto the exposed side of sub-cell 230 within scribe 220, which will serve to electrically insulate the bottom contact layers 212 and window layers 214 of the first sub-cell 230 from those of the second sub-cell 232, after conducting material 226 is deposited. Gap 223 functions to provide access for subsequently depositing material (described in the next step) to electrically connect the top contact layer 218 of sub-cell 230 with the bottom contact layer 212 of sub-cell 232.

Unlike the double scribe method 100, the single scribe method 200 involves the ability to print or otherwise deposit an insulating material off to one side of the scribe 220 and have the insulating material adhere to the one side without flowing down to fill the bottom of the scribe 220 and gap 223. Selection of such an insulating material will at least partially be a function of the materials used to fabricate the thin film stack layers 211. The Applicant asserts, however, that one of ordinary skill of the art of photovoltaics who has read and understands the teachings of this disclosure would be able to select an appropriate material for use as insulator material 222.

Accordingly, the method next proceeds to 265 with depositing an electrically conducting material 226 into the open region created by the scribe 220. The electrically conducting material 266 is applied over the insulator material 222 and over a region of the bottom contact layer 212 of the second sub-cell 232 which was exposed through the gap 223 such that the electrically conducting material 226 electrically couples a top contact layer 218 of the first sub-cell 230 to the bottom contact layer 212 of the second sub-cell 232. Further, the insulator material 222 electrically insulates the electrically conducting material 226 from a bottom contact layer 212 of the first sub-cell 230, as illustrated generally at 204.

In one embodiment, the electrically conducting material 226 is printed into scribe 220. In the same manner as shown in FIG. 1c, the resulting electrical interconnection structure creates a series interconnection of the first sub-cell 230 and second sub-cell 232 that sums the voltages generated by each respective sub-cell and drives photo generated current preferentially from one sub-cell to the next to eventually be collected at the edges of the module. Steps 255 to 265 of the method 200 may be repeated as many times as needed until the original thin film stack layers 211 have been divided into the desired number of series interconnected sub-cells.

Figure 3:
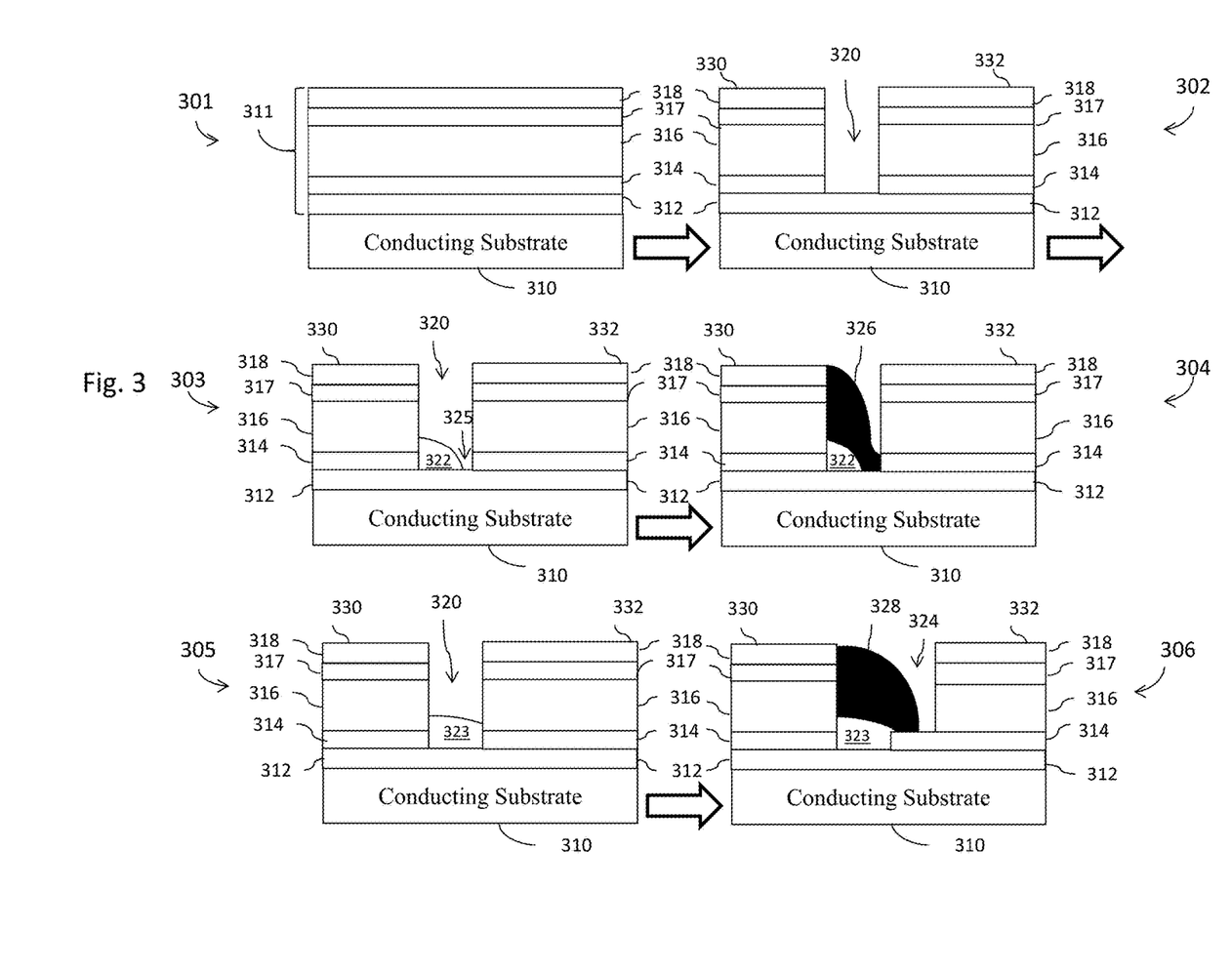
FIG. 3 provides a block diagram chart illustrating a method for fabricating sub-cell interconnects of the present disclosure.

As mentioned above, the single and double scribe methods 100 and 200 described above can also be applied to embodiments comprising non-inverted solar cell structures with conducting substrates (which may be either transparent or non-transparent) as well as non-conducting substrates. For example, FIG. 3 illustrates generally at 301 thin film stack layers 311 which have been deposited on a conducting substrate 310 (which may comprise a metal foil, for example). Thin film stack layers 311 comprise a dielectric material layer 312, a bottom contact layer 314 (which may be a metal material, for example, or a transparent conducting material), an absorber layer 316, a window layer 317 and a top contact layer 318, which may be transparent and may comprise a transparent conducting material, (such as TCO) or alternatively may be a metal conductor. In a "non-inverted" configuration, light enters through a transparent top contact layer 318 and penetrates to the absorber layer 316. Absorber layer 316 may incorporate one of a wide range of photovoltaic technologies, such as but not limited to, CdTe, InP, copper indium selenide (CIS), copper indium gallium diselenide (CIGS), crystalline-Si, amorphous-Si, or thin film organics.

As with the structures previously discussed above, the methods described herein may utilize either single scribing or double scribing processes to also perform both the task of physically subdividing non-inverted thin film stack layers 311 into a plurality of sub-cells, and the task of forming electrical interconnection structures between neighboring sub-cells.

As shown generally at 302, scribe 320 opens up the thin film stack layers 311 from top contact layer 318 down to the dielectric material layer 312, dividing the thin film stack layers 311 into a first sub-cell 330 and a second sub-cell 332. For an implementation with a conducting substrate 310, the dielectric material layer 312 serves to electrically isolate the conducting substrate 310 from the balance of the thin film stack layers 311.

In the case of single scribing (illustrated at 303 and 304), an amount of insulator material 322 off to one side of the scribe 320 and have the insulator material 322 adhere to the one side without flowing down to fill the bottom of the scribe 320 and gap 325. Then a conducting contact material 326 can be applied into the open region defined by the first scribe 320, applying the conducting contact material 326 over the insulator material 322 and over the region of the bottom contact layer 314 of the second sub-cell 332 which was exposed through gap 325. A sufficient amount of the conducting contact material 326 is applied such that the conducting contact material 326 electrically couples the top contact layer 318 of the first sub-cell 330 to the bottom contact layer 312 of the second sub-cell 332, as illustrated generally at 304. This resulting electrical interconnection structure provides series interconnection of the first sub-cell 330 and second sub-cell 332 that sums the voltages generated by each respective sub-cell as explained above and illustrated in FIG. 1c. In the case of double scribing (illustrated at 305 and 306), an insulator material 323 is applied across the bottom of the scribe 320 from the first sub-cell 330 to the second sub-cell 332, as illustrated generally at 305. For example, in one embodiment, a dielectric material layer is printed to electrically separate the bottom contact layers 314 and absorber layer 316 of the first sub-cell 330 from those of the second sub-cell 332. After a second scribe 324 is opened sufficiently through the thin film stack layers 311 of the second sub-cell 332 to expose at least some portion of bottom contact layer 314, a conducting contact 328 is applied into the open region defined by the first and second scribe regions 320, 324, applying the conducting contact material 328 over the insulator material 323 and over the region of the bottom contact layer 314 of the second sub-cell 332 which was exposed by the second scribe 324. At least some portion of the bottom contact layer 314 may be removed by the second scribe to expose the bottom contact layer 314. A sufficient amount of the conducting contact material 328 is applied such that it electrically couples the top contact layer 318 of the first sub-cell 330 to the bottom contact layer 314 of the second sub-cell 332, as illustrated generally at 306. This resulting electrical interconnection structure provides a series interconnection of the first sub-cell 330 and second sub-cell 332 that sums the voltages generated by each respective sub-cell as described above. The Applicant asserts that one of ordinary skill of the art of photovoltaics who has read and understands the teachings of this disclosure would be able to select appropriate materials for use as insulator material 322, 323 and contact materials 326 and 328 based on the composition of thin film stack layers 311.

Figure 4:
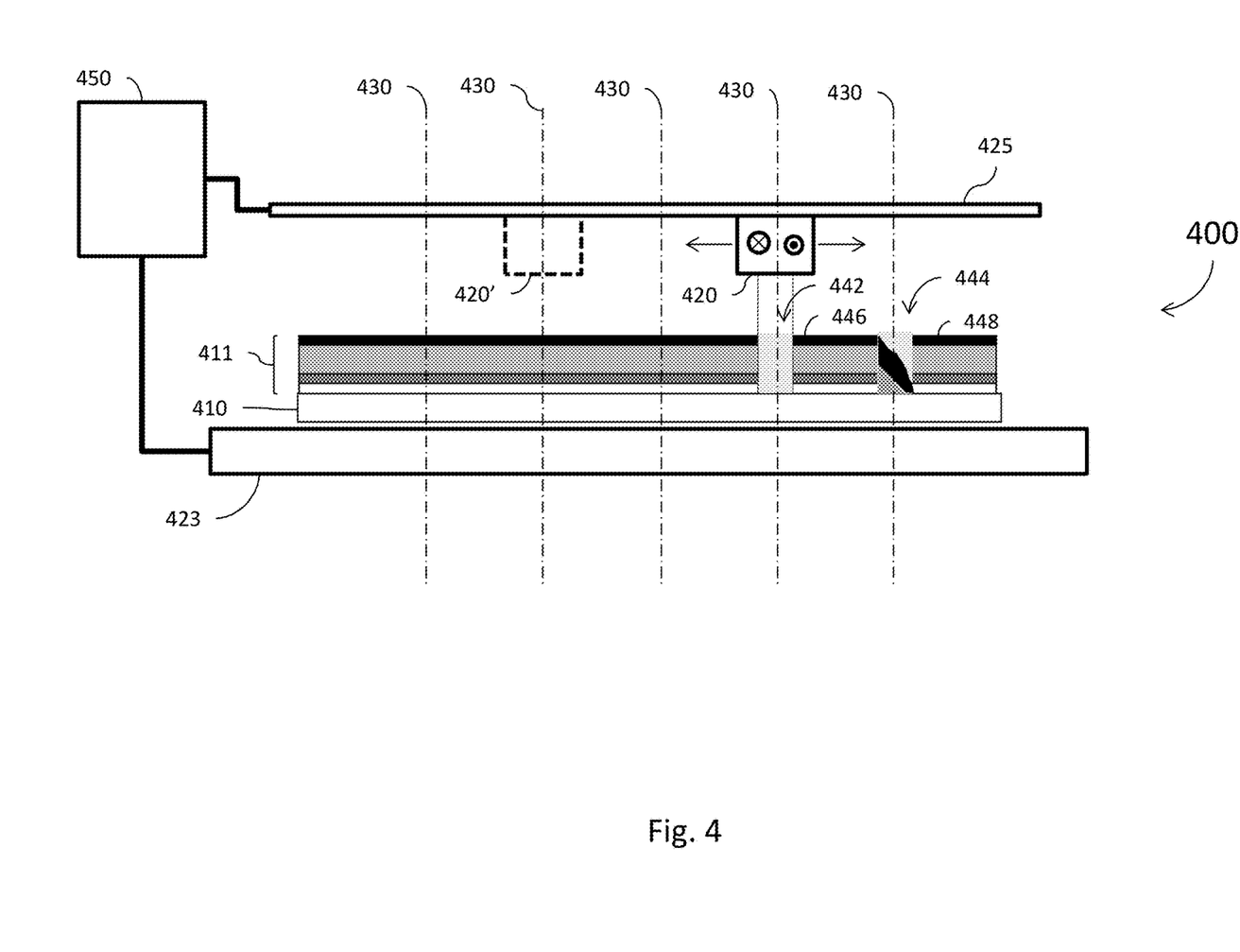
FIG. 4 is a diagram illustrating a fabrication system of one embodiment of the present disclosure.

FIG. 4 is a diagram illustrating a fabrication system 400 having a hybrid interconnection tool 420 that combines both a scribing tool (which may be either a mechanical tool or an optical/laser tool) and a printing tool for depositing electrical interconnection structures within scribes created by the scribing tool. System 400 includes a carrier 423 that physically supports substrate 410 and thin film stack layers 411 in position within fabrication system 400. Substrate 410 and thin film stack layers 411 may comprise any a combination of substrate materials and thin film stack layers described above. Hybrid interconnection tool 420 is aligned with respect to specific positions 430 of thin film stack layers 411 by positioning member 425. In one embodiment, positioning member 425 comprises an arm, servo, track, or other means for precisely adjusting the location of hybrid interconnection tool 420. In other embodiments, instead of adjusting the location of hybrid interconnection tool 420, carrier 423 may instead be controlled to adjust the alignment of hybrid interconnection tool 420 with positions on thin film stack layers 411. As such, the relative positioning of hybrid interconnection tool 420 and thin film stack layers 411 may be adjusted left-to-right, and in-and-out, with respect to the perspective provided by FIG. 4.

In operation, in one embodiment, hybrid interconnection tool 420 subdivides thin film stack layers 411 into a plurality of individual sub-cells (such as shown at 446 and 448) and installs sub-cell electrical interconnection structures (such as shown at 444 between said sub-cells) by implementing either a single scribing or double scribing process such as in accordance with methods 100 or 200 discussed above, or a combination thereof. That is, as hybrid interconnection tool 420 is aligned to a position 430 where a sub-cell interconnect is to be performed, its scribing tool may be used to open the appropriate scribe(s) 442, while its depositing tool applies the appropriate insulating material and contact material to form a series electrical interconnect between adjoining sub-cells such as described above. Although the methods above are described in terms of fabrication of a single interconnect, it should be appreciated that multiple instances of the method may be conducted concurrently by a fabrication system such as system 400. That is, hybrid interconnection tool 420 may sequentially position itself at each of the plurality of positions 430 to perform a step of method 100 or method 200, and then sequentially position itself again at each of the plurality of positions 430 to perform the next step of method 100 or method 200. Further, the hybrid interconnection tool 420 may be implementing a single scribing process and one position 430 while implementing a double scribing process at another position 430. In some alternate embodiments, system 400 may comprise one or more additional hybrid interconnection tools (illustrated by 420') operating as described with respect to hybrid interconnection tool 420.

In one embodiment, system 400 further comprises a controller 450 having a processor and a memory storing instruction code for programming the processor to operate hybrid interconnection tool 420 to fabricate single scribing sub-cell interconnects, double scribing sub-cell interconnects, or a combination thereof based on an algorithm such as illustrated by method 100 and method 200. In one embodiment, controller 450 is coupled to positioning member 425 to control the positioning of hybrid interconnection tool 420 with respect to positions 430. In other embodiments, controller 450 controls the position of carrier 423 to control the aligning of hybrid interconnection tool 420 with respect to positions 430. It is noted that the examples discussed above are provided for purposes of illustration and is not intended to be limiting. Still other embodiments and modifications are also contemplated.

Several means are available to implement the systems and methods discussed in the present figures and specification. For example, the methods 100 and 200 described above, or a controller such as the controller 450 of FIG. 4, may be implemented using hardware devices such as, but are not limited to, digital computer systems, microprocessors, application-specific integrated circuits (ASIC), general purpose computers, programmable controllers and field programmable gate arrays (FPGAs), all of which may be generically referred to herein as "processors." For example, in one embodiment, controller algorithms may be implemented by an FPGA or an ASIC, or alternatively by an embedded or discrete processor. Therefore, other embodiments of the present disclosure are program instructions resident on computer readable media which when implemented by such means enable them to implement various embodiments. Computer readable media include any form of a non-transient physical computer memory device. Examples of such a physical computer memory device include, but are not limited to, punch cards, magnetic disks or tapes, optical data storage systems, flash read only memory (ROM), non-volatile ROM, programmable ROM (PROM), erasable-programmable ROM (E-PROM), random access memory (RAM), or any other form of permanent, semi-permanent, or temporary memory storage system or device. Program instructions include, but are not limited to computer-executable instructions executed by computer system processors and hardware description languages such as Very High Speed Integrated Circuit (VHSIC) Hardware Description Language (VHDL).

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method comprising:
opening, in a device comprising thin film stack layers deposited on a substrate, a first scribe through a top contact layer, an absorber layer, and a bottom contact layer of the thin film stack layers, wherein the first scribe divides the thin film stack layers into a first sub-cell and a second sub-cell, and wherein the first scribe exposes a side of the bottom contact layer of the first sub-cell and a side of the bottom contact layer of the second sub-cell;
printing, subsequent to opening the first scribe, one or more layers of an insulator material across a bottom of the first scribe, from the first sub-cell to the second sub-cell, such that the insulator material covers the side of the bottom contact layer of the first sub-cell and the side of the bottom contact layer of the second sub-cell;
opening, subsequent to printing the insulator material, a second scribe in the second sub-cell, adjacent to the first scribe, from the top contact layer and sufficiently through the thin film stack layers to expose at least a portion of the bottom contact layer of the second sub-cell; and
depositing, subsequent to opening the second scribe, an electrically conducting material into the first and second scribes such that the electrically conducting material electrically couples the top contact layer of the first sub-cell to the bottom contact layer of the second sub-cell, wherein the insulator material electrically insulates the electrically conducting material from the bottom contact layer of the first sub-cell.

2. The method of claim 1, wherein the substrate is non-conductive.

3. The method of claim 1, wherein the thin film stack layers further comprise a window layer between the absorber layer and the bottom contact layer.

4. The method of claim 1, wherein the absorber layer comprises a P-N photovoltaic junction comprising at least one of CdTe, InP, copper indium selenide (CIS), copper indium gallium diselenide (CIGS), crystalline-Si, amorphous-Si, or an organic semiconductor material.

5. The method of claim 1, wherein each of the first scribe and the second scribe is opened using at least one of a mechanical scribing tool or a laser scribing tool.

6. The method of claim 1, wherein the substrate is electrically conductive and wherein the thin film stack layers further comprise a dielectric material layer positioned between the substrate and the bottom contact layer.

* * * * *